(12) United States Patent
Yu et al.

(10) Patent No.: US 8,387,933 B2
(45) Date of Patent: Mar. 5, 2013

(54) CABLE MANAGEMENT APPARATUS

(75) Inventors: Mo-Ming Yu, Shenzhen (CN); Ze-Hong Chen, Shenzhen (CN); Guang-Hua Gu, Shenzhen (CN); Wen-Feng Hu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 122 days.

(21) Appl. No.: 12/846,853

(22) Filed: Jul. 30, 2010

(65) Prior Publication Data

US 2011/0290955 A1   Dec. 1, 2011

(30) Foreign Application Priority Data

May 31, 2010 (CN) .......................... 2010 1 0187532

(51) Int. Cl.
    *A47B 96/06* (2006.01)
(52) U.S. Cl. ................... 248/220.22; 312/330.1; 211/26
(58) Field of Classification Search ............ 248/220.31, 248/222.11, 222.12, 221.11, 225.11, 220.21, 248/220.22, 220.41; 211/26, 175, 189, 187; 174/69; 312/223.1, 330.1, 265.1, 265.4
    See application file for complete search history.

(56) References Cited

U.S. PATENT DOCUMENTS

| | | | |
|---|---|---|---|
| 6,070,742 A * | 6/2000 | McAnally et al. | 211/26 |
| 6,303,864 B1 * | 10/2001 | Johnson et al. | 174/69 |
| 6,305,556 B1 * | 10/2001 | Mayer | 211/26 |
| 6,435,354 B1 * | 8/2002 | Gray et al. | 211/26 |
| 6,442,030 B1 * | 8/2002 | Mammoser et al. | 361/727 |
| 6,523,918 B1 * | 2/2003 | Baiza | 312/265.1 |
| 6,600,665 B2 * | 7/2003 | Lauchner | 361/826 |
| 6,715,718 B1 * | 4/2004 | Chen et al. | 248/49 |
| 6,747,874 B2 * | 6/2004 | McKinnon et al. | 361/724 |
| 6,896,344 B2 * | 5/2005 | Tsutsumi et al. | 312/330.1 |
| 7,009,112 B1 * | 3/2006 | Mead et al. | 174/69 |
| 7,023,708 B2 * | 4/2006 | Nguyen et al. | 361/810 |
| 7,026,551 B2 * | 4/2006 | Franz et al. | 174/69 |
| 7,472,795 B2 * | 1/2009 | Dubon et al. | 211/26 |
| 7,554,819 B2 * | 6/2009 | Chen et al. | 361/826 |
| 7,694,926 B2 * | 4/2010 | Allen et al. | 248/244 |
| 7,703,734 B2 * | 4/2010 | Chen et al. | 248/298.1 |
| 7,712,615 B2 * | 5/2010 | Chen et al. | 211/26 |
| 7,746,667 B1 * | 6/2010 | Baiza et al. | 361/825 |
| 7,806,277 B2 * | 10/2010 | Mimlitch et al. | 211/26 |
| 8,045,343 B2 * | 10/2011 | Fan et al. | 361/826 |
| 2003/0026084 A1 * | 2/2003 | Lauchner | 361/826 |
| 2004/0056155 A1 * | 3/2004 | Chen et al. | 248/49 |
| 2004/0079711 A1 * | 4/2004 | Hartman et al. | 211/26 |
| 2004/0120134 A1 * | 6/2004 | Nguyen et al. | 361/825 |
| 2005/0145582 A1 * | 7/2005 | Dubon et al. | 211/26 |

(Continued)

*Primary Examiner* — Nkeisha Smith
(74) *Attorney, Agent, or Firm* — Altis Law Group, Inc.

(57) ABSTRACT

A cable management member is mounted between two slide rail apparatuses. The cable management member includes an arm assembly and a support member. The arm assembly includes a rear arm, a front arm, and a connecting member pivotably connected to the rear arm and the front arm. First ends of the rear arm and the front arm opposite to the connecting member are correspondingly pivotably connected to a stationary rail and a movable rail of one of the slide rail apparatuses. Opposite ends of the support member are correspondingly connected to the two slide rail apparatuses, and slidable relative to the stationary rails of the corresponding slide rail apparatuses. The connecting member is slidably supported on the support member. The connecting member includes a first positioning button and a second positioning button to restrict the support member therebetween, thereby preventing the support member from disengaging from the connecting member.

8 Claims, 10 Drawing Sheets

U.S. PATENT DOCUMENTS

| | | | |
|---|---|---|---|
| 2006/0081735 A1* | 4/2006 | Chen et al. | 248/68.1 |
| 2006/0081736 A1* | 4/2006 | Chen et al. | 248/68.1 |
| 2006/0113433 A1* | 6/2006 | Chen et al. | 248/70 |
| 2009/0014601 A1* | 1/2009 | Chen et al. | 248/70 |
| 2009/0065658 A1* | 3/2009 | Chen et al. | 248/70 |
| 2010/0282932 A1* | 11/2010 | Ong et al. | 248/206.5 |
| 2011/0253647 A1* | 10/2011 | Yu et al. | 211/26 |

* cited by examiner

CABLE MANAGEMENT APPARATUS

BACKGROUND

1. Technical Field

The present disclosure relates to cable management and, more particularly, to a cable management apparatus for a rack-mounted device.

2. Description of the Related Art

Commonly used component racks often include a pair of opposing sides to which telescoping slide rail apparatuses are connected for slidable support of electronic devices, such as servers. Typically, multiple devices are often located at different vertically spaced levels in the equipment rack, usually closely adjacent to each other. Cables extend from the electronic devices for connection outside the equipment rack.

A cable management apparatus is provided for supporting cables of each of the electronic devices in the rack. The cable management apparatus often includes at least two arms pivotally connected end to end. Opposite free ends of the cable management apparatus are correspondingly attached to a stationary rail and a movable rail of one of the slide rail apparatuses. Accordingly, the cable management apparatus spreads with extension of the slide rail apparatus, and collapses with retraction. Since the cable management apparatus cantilevers from the slide rail apparatus, sagging due to the weight of the cables can occur, negatively affecting the operation of the connected electronic device.

DETAILED DESCRIPTION

Figure 1:
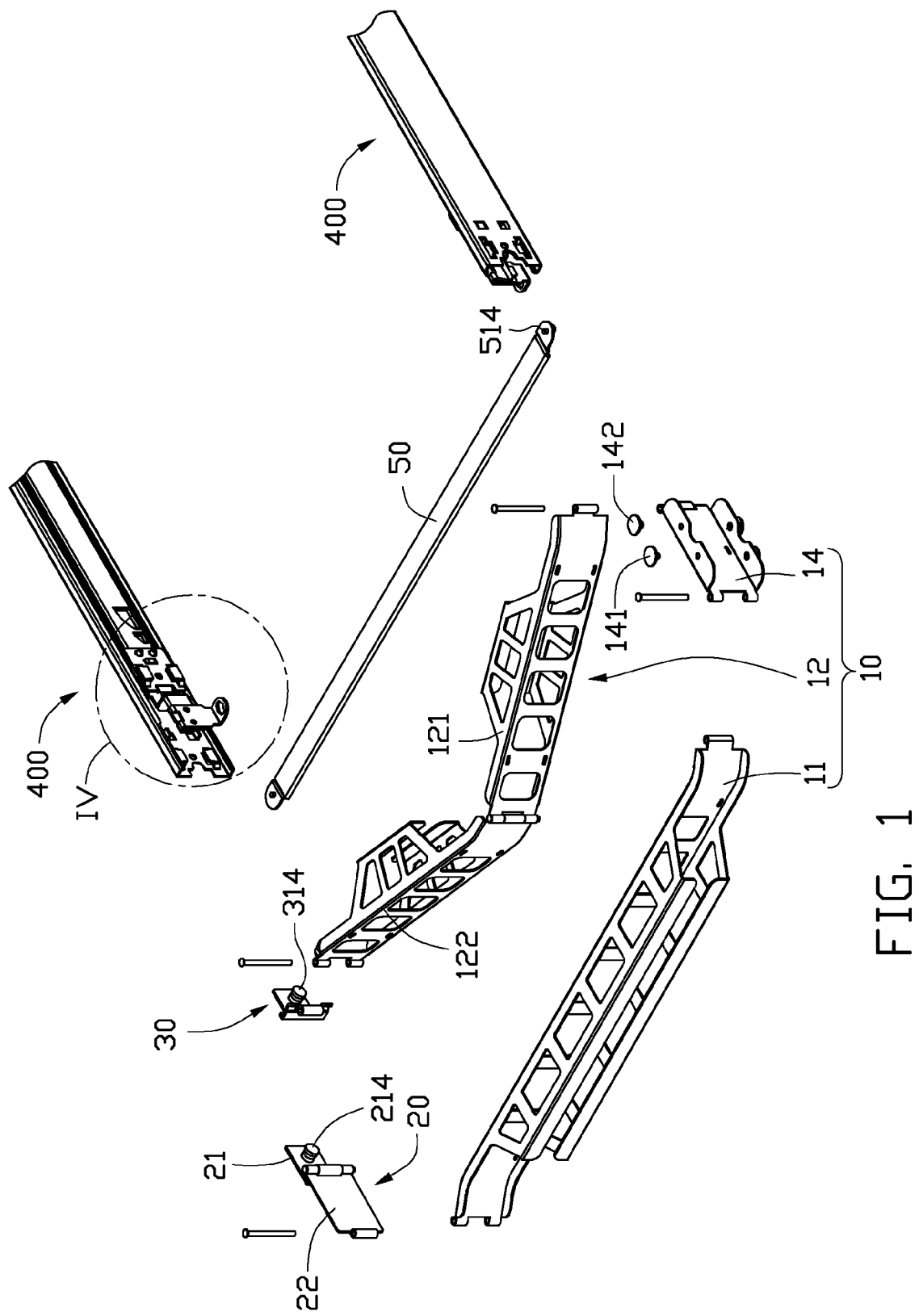
FIGS. 1 and 2 are exploded, isometric views from different perspectives of an embodiment of a cable management apparatus, with two opposite slide rail apparatuses.
Figure 2:
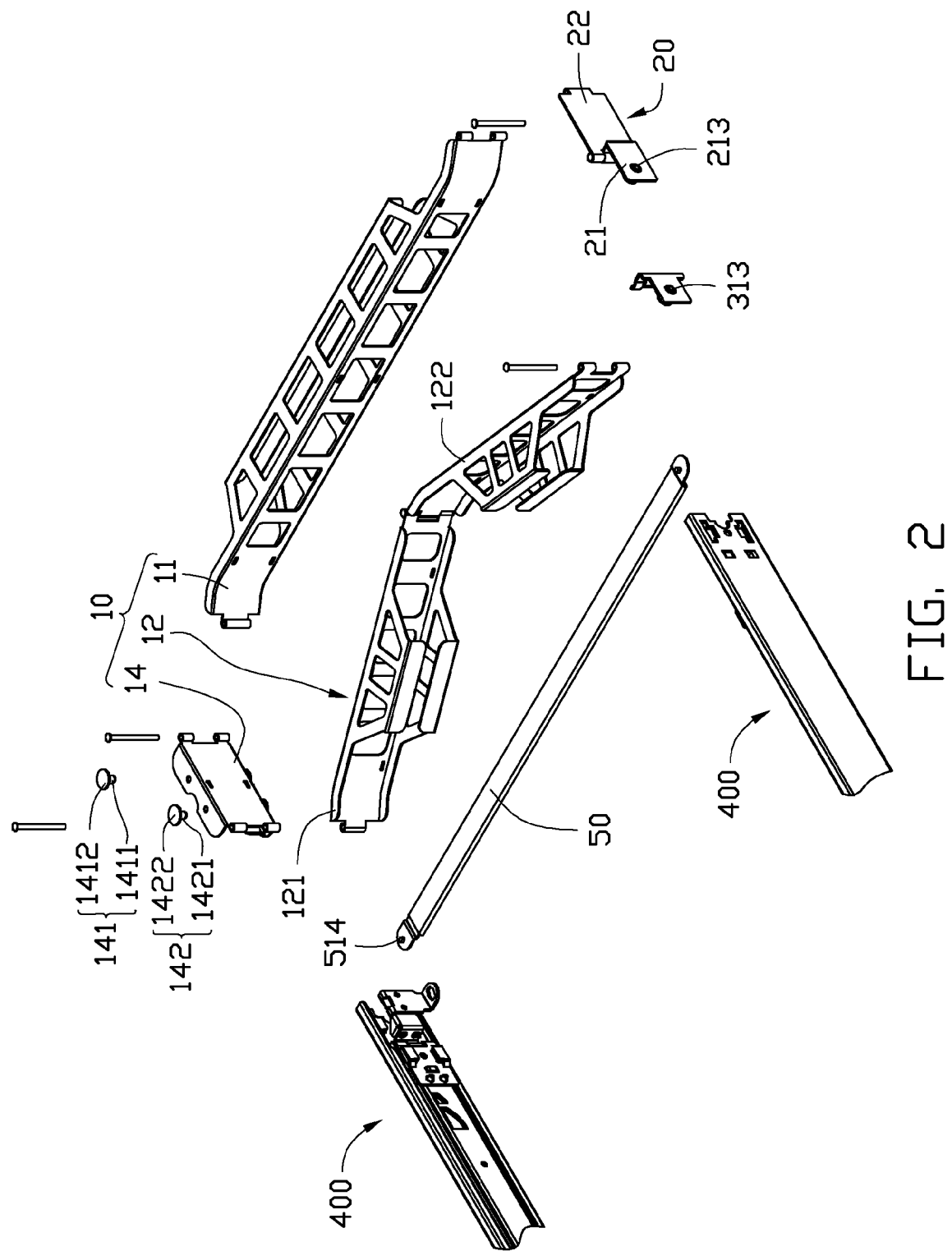

Referring to FIGS. 1 and 2, an embodiment of a cable management apparatus is provided between two opposite slide rail apparatuses 400, which are mounted to opposite sides of an equipment rack for slidably mounting an electronic device, such as a sever (not shown), to the equipment rack. The cable management apparatus includes an arm assembly 10, a first mounting member 20, a second mounting member 30, and a support member 50.

Figure 3:
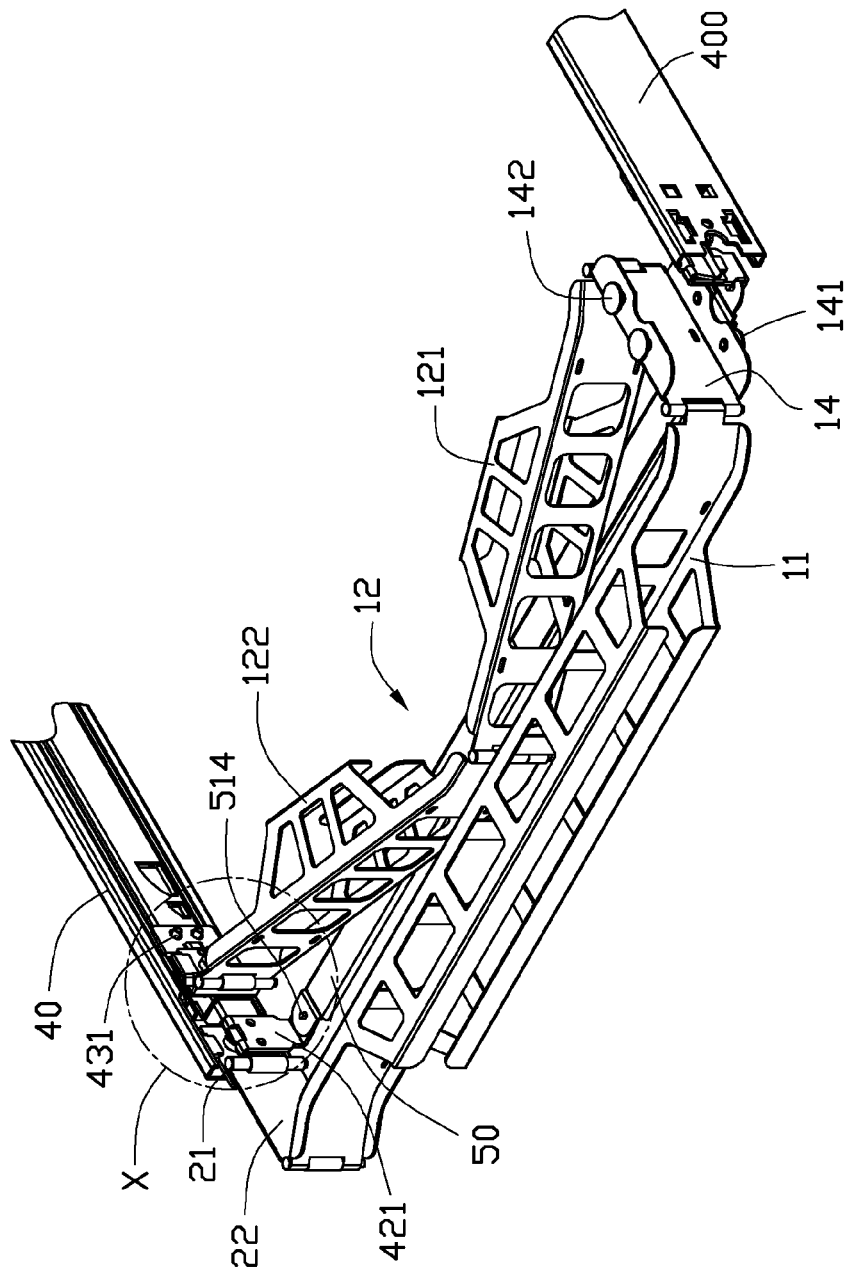
FIG. 3 is an assembled view of FIG. 1.
Figure 4:
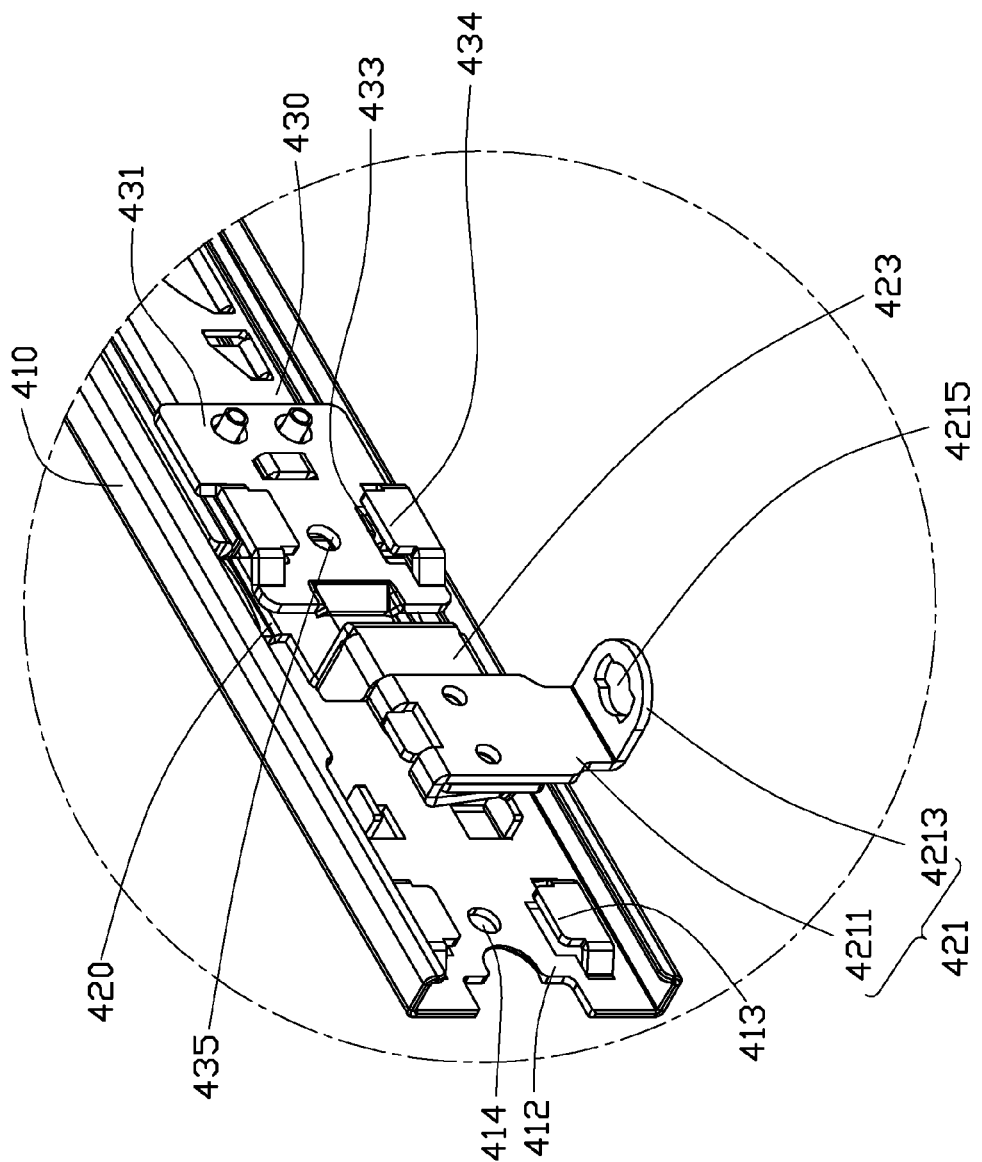
FIG. 4 is an enlarged view of an encircled portion IV of FIG. 1.

Referring to FIGS. 2 to 4, each of the slide rail apparatuses 400 includes a stationary rail 410 fixed to the equipment rack, a first movable rail slidably received in the stationary rail 410, and a second movable rail slidably received in the first movable rail and attached to the electronic device. In one embodiment, the first movable rail is an intermediate rail 420, the second movable is an inner rail 430.

Each of the stationary rails 410 forms two bow-shaped tabs 413 adjacent to a rear end of the stationary rail 410 to cooperatively bound a guide slot 412. Since each of the tabs 413 includes a larger middle portion and two smaller end portions at the front and rear sides of the larger middle portion, the guide slot 412 includes a narrowed opening. A locking hole 414 is defined in the stationary rail 410 between the two tabs 413.

The intermediate rail 420 forms an elongated portion 423 at the rear end of the intermediate rail 410. An L-shaped linking plate 421 is coupled to the elongated portion 423. The linking plate 421 is positioned in front of the guide slot 412 of the stationary rail 410, and includes a retaining portion 4211 engaging with the elongated portion 423 of the intermediate rail 420, and a mounting portion 4213 perpendicularly extending from a bottom of the retaining portion 4211 away from the stationary rail 410. The mounting portion 4213 defines a coupling hole 4215.

A locking plate 431 is secured to a rear end of the inner rail 430, and positioned in front of the linking plate 421. The locking plate 431 forms two bow-shaped tabs 434 to cooperatively bound a guide slot 433. Since each of the tabs 434 includes a larger middle portion and two smaller end portions at the front and rear sides of the larger middle portion, the guide slot 433 includes a narrowed opening. A locking hole 435 is defined in the locking plate 431 between the two tabs 434.

The arm assembly 10 includes a rear arm 11, a front arm 12, and a connecting member 14 between the rear arm 11 and the front arm 12. In one embodiment, the front arm 12 includes a first arm segment 121 and a second arm segment 122, the first ends of the first and second arm segments 121 and 122 are hinged with each other. The rear arm 11, and the first and second arm segments 121 and 122 of the front arm 12 are lengthwise brackets to accommodate the cables of the electronic device. A length of the first arm segment 121 or the second arm segment 122 is less than a length of the rear arm 11, but a total length of the first arm segment 121 and a second arm segment 122 is not less than the length of the rear arm 11.

Opposite ends of the connecting member 14 are correspondingly pivotably connected to a first end of the rear arm 11, and a second end of the first arm segment 121 of the front arm 12 far away from the second arm segment 122. The connecting member 14 includes top and bottom flanges opposite to each other. Two first blocking buttons 141 are correspondingly positioned at the top and bottom flanges of the connecting member 14, and adjacent to the rear arm 11. Each of the first blocking buttons 141 includes a neck 1411 depending on the connecting member 14, and a head 1412 at an end of the neck 1411. Two second blocking buttons 142 are correspondingly positioned at the top and bottom flanges of the connecting member 14, and adjacent to the front arm 12. Each of the second blocking buttons 142 includes a neck 1421 depending on the connecting member 14, and a head 1422 at an end of the neck 1421.

The first mounting member 20 includes a locking piece 21 and a connecting piece 22 pivotably connected to the locking piece 21. The locking piece 21 defines a through hole 213 therein. A locking button 214 is attached to the locking piece 21, and aligned with the through hole 213 of the locking piece 21. The connecting piece 22 is pivotably connected to a second end of the rear arm 11 opposite to connecting member 14.

The second mounting member 30 defines a through hole 313. A locking button 314 is attached to the second mounting member 30, and aligned with the through hole 313. The second mounting member 30 is pivotably connected to a second end of the second arm segment 122 opposite to the first arm segment 121 of the front arm 12.

The support member 50 is a rail with flat top and bottom walls. Two coupling pins 514 extend from the top wall of the support member 50, and correspondingly adjacent to opposite ends of the support member 50.

Referring to FIGS. 1-3, in assembly, the two coupling pins 514 of the support member 50 are correspondingly engaged in the coupling holes 4215 of the linking plates 421 of the opposite slide rail apparatuses 400, therefore, the support member 50 is connected between the opposite slide rail apparatuses 400 and located at rear ends of the intermediate rails 420 of the corresponding slide rail apparatuses 400.

Figure 9:
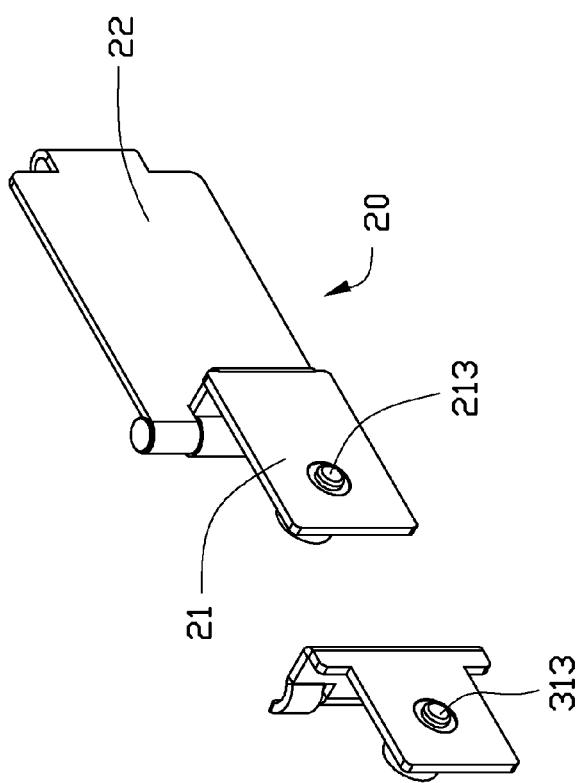
FIG. 9 is an enlarged view of the first mounting member and the second mounting member of FIG. 2.
Figure 10:
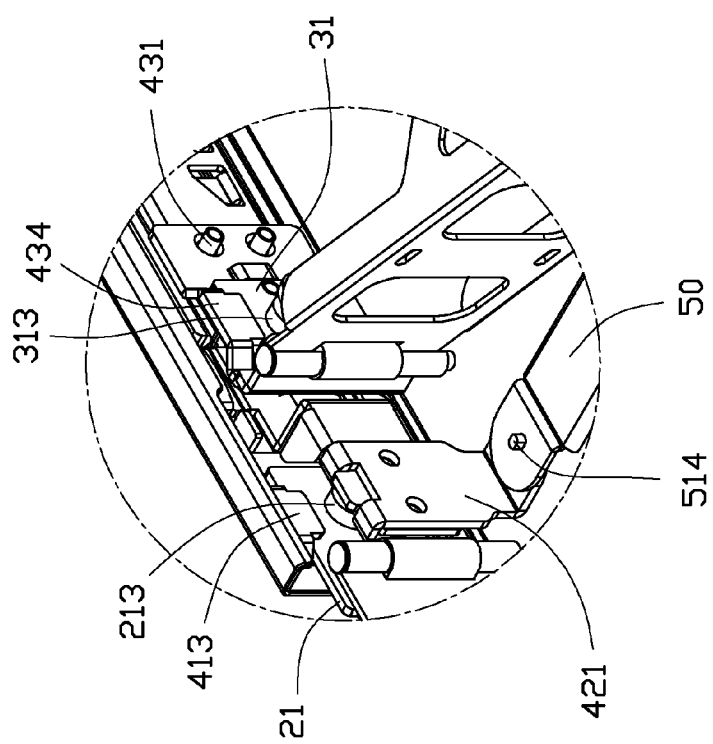
FIG. 10 is an enlarged view of an encircled portion X of FIG. 3.

Referring also to FIGS. 4, 9 and 10, the locking piece 21 of the first mounting member 20 is inserted into the guide slots 412 of the stationary rail 410 of one of the two slide rail apparatuses 400, with the through hole 213 of the locking piece 21 aligned with the locking hole 414 of the stationary rail 410. The locking button 214 then extends through the through hole 213 and engages in the locking hole 414 of the stationary rail 410, to lock the locking piece 21 of the first mounting member 20 to the stationary rail 410. The second mounting member 30 is inserted into the guide slots 433 of the inner rail 430 of the slide rail apparatus 400, with the through hole 313 of the second mounting member 30 aligned with the locking hole 435 of the inner rail 430. The locking button 314 then extends through the through hole 313 and engages in the locking hole 435 of the locking plate 431 of the inner rail 430, to lock the second mounting member 30 to the rear end of the inner rail 430.

Figure 8:
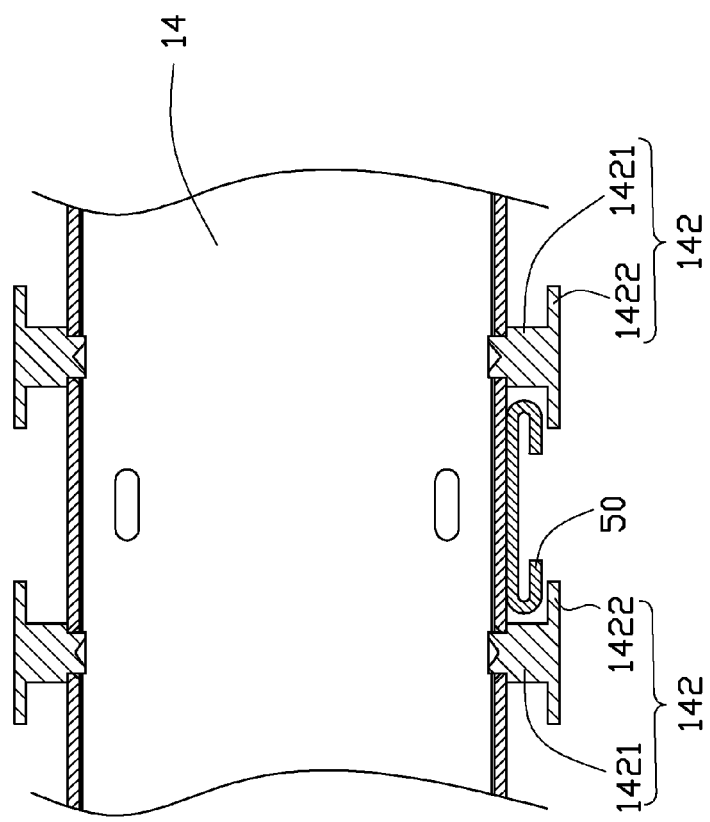
FIG. 8 is a sectional view in an enlarged scale taken along line VIII-VIII of FIG. 7.

The connecting member 14 is moved to make the support member 50 position between the first and second blocking buttons 141 and 142 on the bottom flange of the connecting member 14. Referring to FIG. 8, with the connecting member 14 sliding on the supporting member 50, the supporting member 50 may be blocked by the neck 1411 of the first blocking button 141 or the neck 1421 of the second blocking button 142, thereby being restricted between the first and second blocking buttons 141 and 142, and being prevented from disengaging from the connecting member 14.

Figure 5:
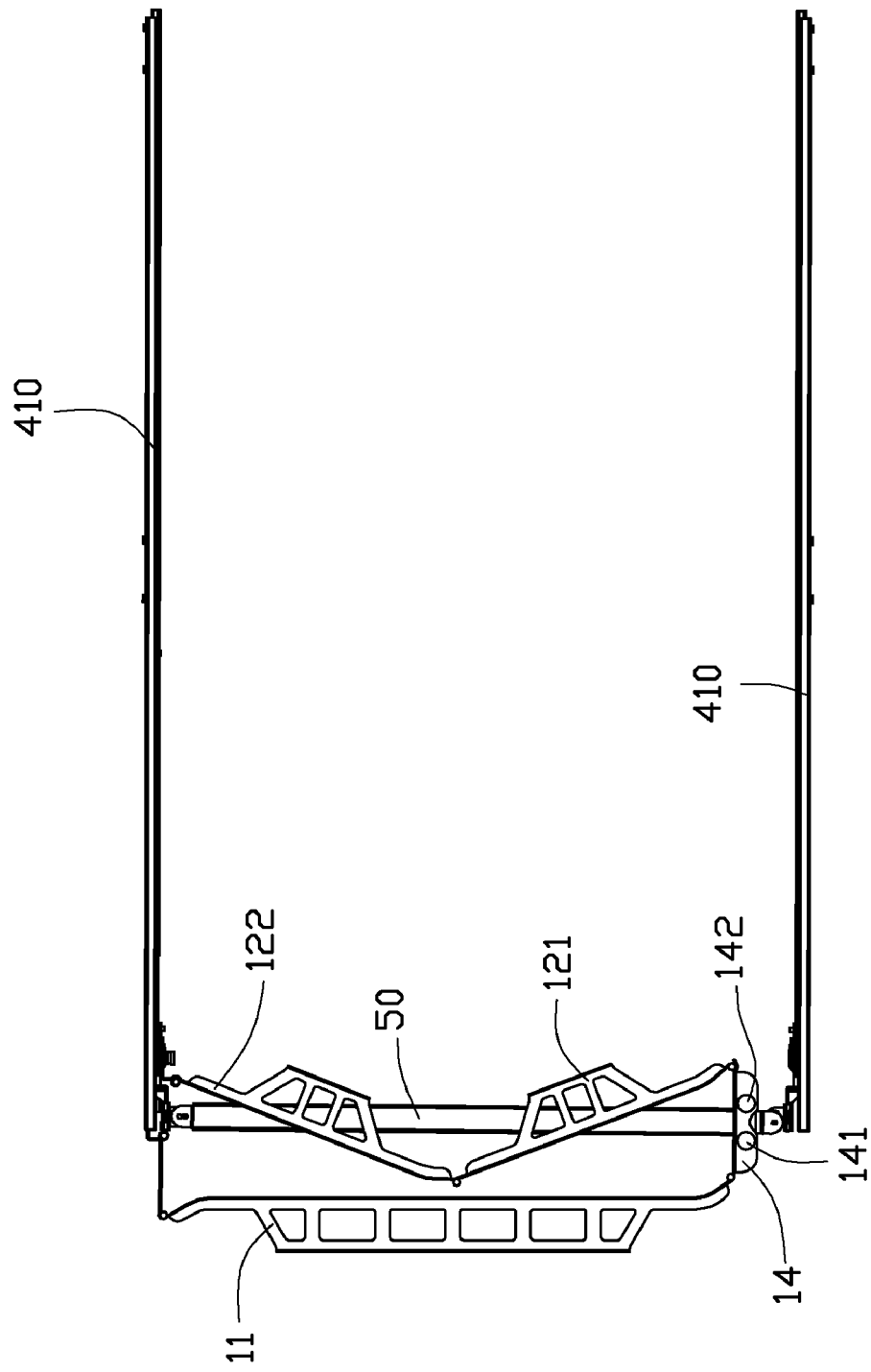
FIGS. 5-7 are top plan views of FIG. 3, correspondingly showing an arm assembly of the cable management apparatus fully folded, partially spread, and fully spread.
Figure 6:
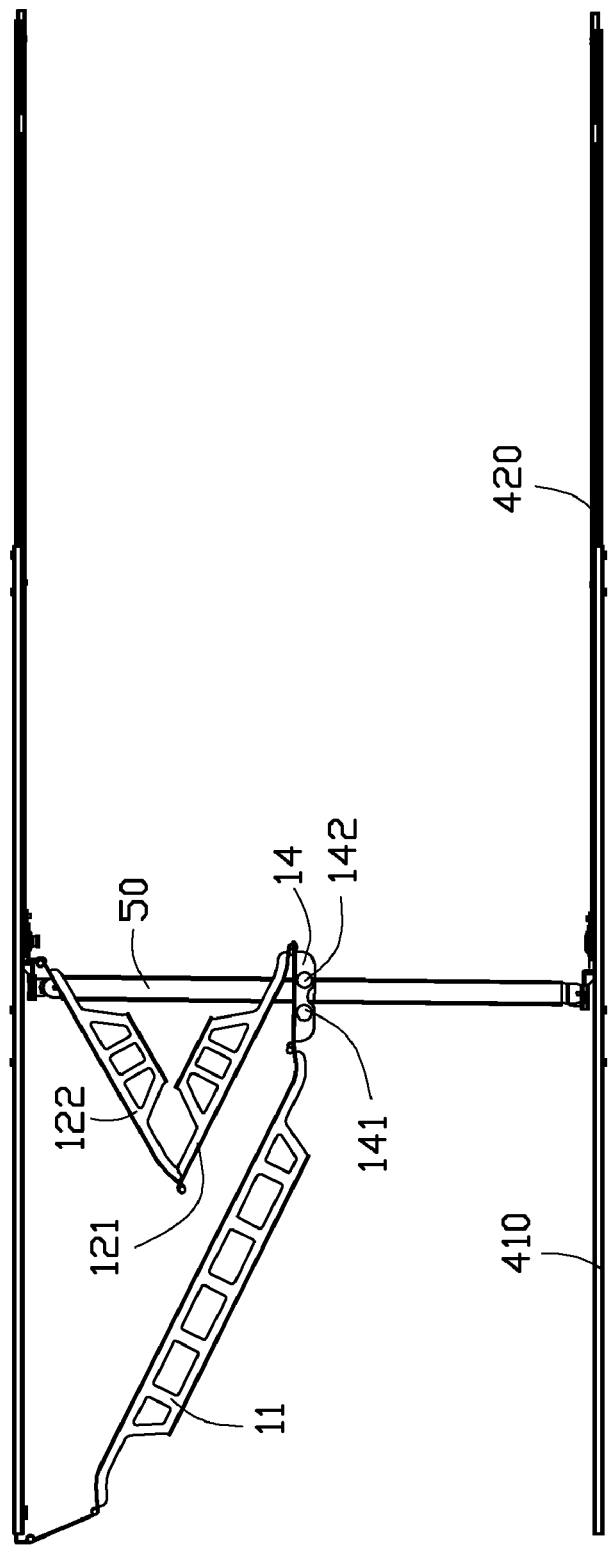
Figure 7:
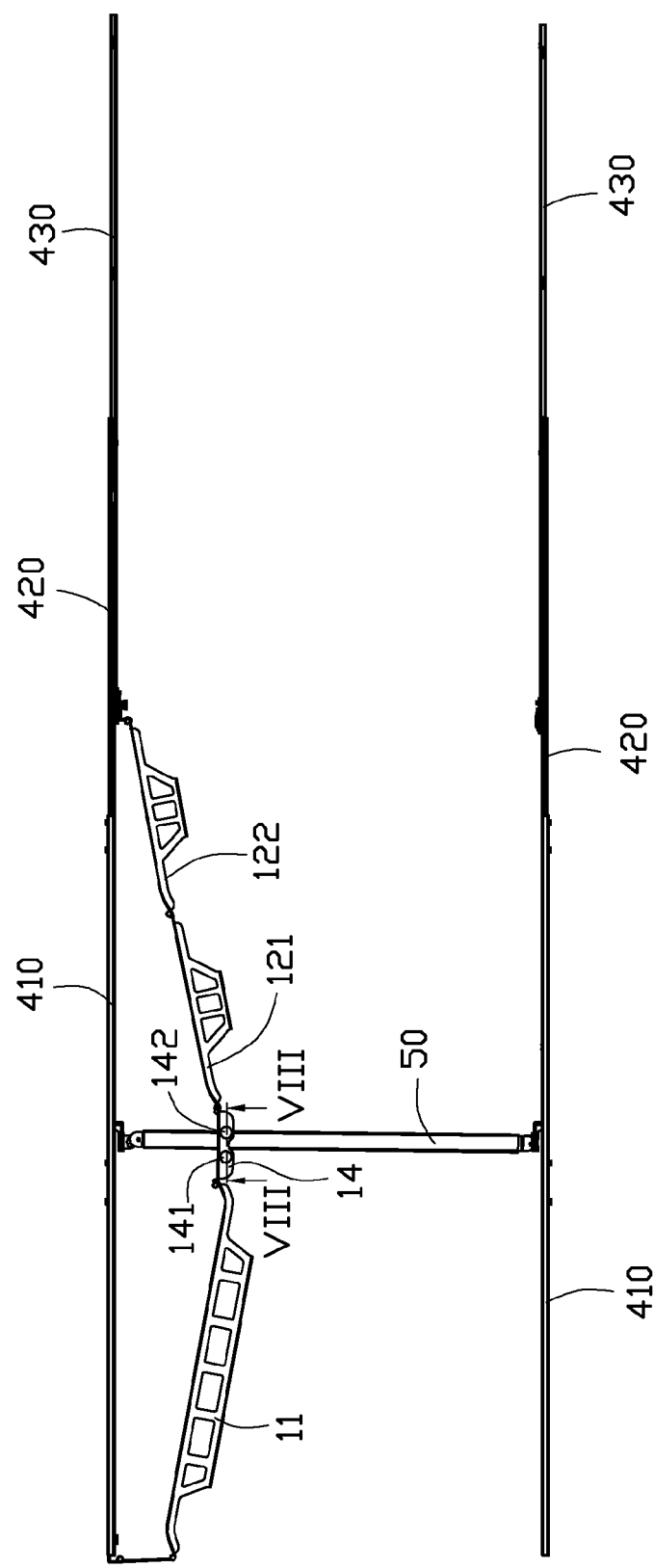

Referring to FIGS. 5-7, in use, when the inner rails 430 and intermediate rails 420 of the slide rail apparatuses 400 slide forward relative to the corresponding stationary rails 410, the second mounting member 30 moves with the corresponding inner rail 430 to spread the arm assembly 10. At the same time, the support member 50 slides forward with the intermediate rails 42. The connecting member 14 slides along the support member 50 towards the second mounting member 30, to make the first and second rail segments 121 and 122 pivot towards each other. After the intermediate rails 420 has been extended forward a predetermined distance, the intermediate rails 420 of the two slide rail apparatuses 400 are stopped by latch mechanism (not shown) in corresponding slide rail apparatuses 400. Therefore, the support member 50 is located at a position shown in FIG. 6. The inner rails 430 continue on sliding forward relative to the corresponding intermediate rails 420, the second mounting member 30 moves with the corresponding inner rail 430 away from the connecting member 14, until the arm assembly 10 is fully spread (shown in FIG. 7). A folding process of the cable management apparatus is performed in a reverse order to the spreading process described above.

It is believed that the present embodiment and its advantages will be understood from the foregoing description, and it will be apparent that various changes may be made thereto without departing from the spirit and scope of the description or sacrificing all of its material advantages, the examples hereinbefore described merely being exemplary embodiments.

What is claimed is:

1. A cable management apparatus located between a first slide rail apparatus and a second slide rail apparatus, each of the first and second slide rail apparatuses comprising a stationary rail, and at least one movable rail slidably coupled to the stationary rail to extend from an end of the stationary rail, the cable management apparatus comprising:
   a foldable arm assembly comprising a rear arm, a front arm, and a connecting member pivotably connected to corresponding first ends of the rear and front arms adjacent to the stationary rail of the second slide rail apparatus, second ends of the rear and front arms opposite to the connecting member being correspondingly pivotably connected to the stationary rail of the first slide rail apparatus and one of the at least one movable rail of the first slide rail apparatus; and
   a support member comprising two opposite ends engaged with the corresponding first and second slide rail apparatuses, slidable along the stationary rails;
   wherein the connecting member is supported by and slidable along the support member, the connecting member comprises a first blocking button and a second blocking button, the support member is restricted between the first and second blocking buttons; and
   wherein each of the first and second blocking buttons comprises a neck depending on the connecting member, and a head formed at a distal end of the neck, the support member is adapted to engage with the necks of the first and second blocking buttons.

2. The cable management apparatus of claim 1, wherein the rear arm of the arm assembly is pivotably connected to the stationary rail of the first slide rail apparatus by a first mounting member, the first mounting member comprises a locking piece locked to the stationary rail, and a connecting piece comprising opposite ends corresponding pivotably engaging with the locking piece and the rear arm of the arm assembly.

3. The cable management apparatus of claim 1, wherein the front arm comprises a first arm segment and a second arm segment pivotably connected to the first arm segment, the first arm segment engages with the connecting member opposite to the second arm segment, the second arm segment is connected to the at least one movable rail of the first slide rail apparatus.

4. The cable management apparatus of claim 3, wherein the second arm segment of the front arm is pivotably connected to the at least one movable rail of the first slide rail apparatus by a mounting member, the mounting member is fixed to the at least one movable rail and hinged with the second arm segment of the front arm.

5. A cable management assembly comprising:
   a first slide rail apparatus comprising a first stationary rail, a first intermediate rail slidably received in the first stationary rail, and a first inner rail slidably received in the first intermediate rail;
   a second slide rail apparatus comprising a second stationary rail, a second intermediate rail slidably received in the second stationary rail, and a second inner rail slidably received in the second intermediate rail;
   a foldable arm assembly comprising a rear arm, a front arm, and a connecting member pivotably connected to corresponding first ends of the rear and front arms, second ends of the rear and front arms opposite to the connecting member being correspondingly pivotably connected to the first stationary rail and the first inner rail of the first slide rail apparatus; and
   a support member having opposite ends respectively directly connected to the first and second intermediate rails of the first and second slide rail apparatuses, and sliding along the first and second stationary rails with an angle between the support member and each of the first and second slide rail apparatuses kept unchanged; wherein the connecting member is supported by and slidable along the support member, the connecting member comprises a first blocking button and a second blocking button, the support member is restricted between the first and second blocking buttons.

6. The cable management assembly of claim 5, wherein each of the first and second intermediate rails comprises a linking plate defining a coupling hole, two coupling pins respectively extend from the opposite ends of the support member to engage in the coupling holes of the corresponding linking plates.

7. The cable management assembly of claim 5, wherein the first stationary rail of the first slide rail apparatus forms two tabs each cooperatively bounding a guide slot and defines a locking hole between the two tabs, the rear arm of the arm assembly is pivotably connected to the first stationary rail of the first slide rail apparatus by a first mounting member hinged with the rear arm of the arm assembly, the first mounting member comprises a locking piece engaged in the guide slot, and defining a through hole, a locking button extends through the through hole of the locking piece, and engages in the locking hole of the stationary rail.

8. The cable management assembly of claim 5, wherein the first inner rail of the first slide rail apparatus comprises a locking plate forming two tabs to cooperatively bounding a guide slot, and defining a locking hole between the two tabs, the front arm of the arm assembly is pivotably connected to the first inner rail of the first slide rail apparatus by a mounting member hinged with the front arm of the arm assembly, the mounting member is engaged in the guide slot of the locking plate and defines a through hole, a locking button is mounted to the mounting member, aligned with through hole, and extends into the locking hole of the locking plate of the first slide rail apparatus.

* * * * *